United States Patent [19]

Daraktchiev

[11] Patent Number: 4,996,080

[45] Date of Patent: Feb. 26, 1991

[54] PROCESS FOR COATING A PHOTORESIST COMPOSITION ONTO A SUBSTRATE

[75] Inventor: Ivan S. Daraktchiev, Louvain, Belgium

[73] Assignee: Olin Hunt Specialty Products Inc., Cheshire, Conn.

[21] Appl. No.: 333,519

[22] Filed: Apr. 5, 1989

[51] Int. Cl.$^5$ .............................................. B05D 3/12
[52] U.S. Cl. ................................... 427/57; 427/240; 427/346; 427/421
[58] Field of Search ................... 427/57, 240, 346, 421

[56] References Cited

U.S. PATENT DOCUMENTS

| | | | |
|---|---|---|---|
| 4,153,201 | 5/1979 | Berger et al. | 239/102 |
| 4,301,968 | 11/1981 | Berger et al. | 239/102 |
| 4,337,896 | 7/1982 | Berger et al. | 239/102 |
| 4,352,459 | 10/1982 | Berger et al. | 239/102 |
| 4,541,564 | 9/1985 | Berger et al. | 239/102 |
| 4,642,581 | 2/1987 | Erickson | 331/154 |
| 4,723,708 | 2/1988 | Berger et al. | 239/102.2 |
| 4,806,455 | 2/1989 | LaBianca | 430/325 |

OTHER PUBLICATIONS

K. Shidmore, "Applying Photoresist for Optical Coatings", Semiconductor International, Feb. 1988, pp. 56–62.

*Primary Examiner*—Bernard Pianalto
*Attorney, Agent, or Firm*—William A. Simons

[57] ABSTRACT

A process for applying a film of uniform thickness of photoresist solids onto a substrate comprising the steps of:

(a) forming a liquid photoresist composition comprising photoresist solids in a solvent; the solids content of said photoresist composition being in the range from about 10% by weight to about 22% by weight;

(b) forming atomized spray droplets of said liquid photoresist composition;

(c) allowing said atomized spray droplets to settle by gravity onto a substrate surface, thereby forming a photoresist coating on that surface; and (d) spinning said coated substrate at a pre-determined spin speed and for a pre-determined time to remove substantially all of said solvent from said photoresist coating and to form a film of uniform thickness of photoresist solids on the substrate.

18 Claims, No Drawings

PROCESS FOR COATING A PHOTORESIST COMPOSITION ONTO A SUBSTRATE

BACKGROUND OF THE INVENTION

1. Field of the Invention

The present invention relates to a process for coating a photoresist composition onto a substrate. In particular, the present invention relates to a process of applying atomized droplets of photoresist composition, preferably by means of an ultrasonic atomizer nozzle, onto a substrate (e.g. silicon wafer) and then forming a film of uniform thickness of photoresist solids by spinning the coated substrate.

2. Description of the Prior Art

Photoresist compositions have been applied to substrates by a variety of conventional techniques such as dip coating, roller coating, pressurized spray coating and spin coating. When the substrate is a wafer for making semiconductor devices, the present preferred method is spin coating.

By this prior art method, the photoresist composition is dispensed on the wafer while it is stopped (creating a puddle) or while it is spinning slowly. After the dispensing step, the wafer is spun at a higher rate and the resist spreads over the wafer surface due to the centrifugal force created by the spinning motion. Most of the dispensed resist is spun off of the edge of the wafer and recovered in a cup below the wafer. A film of uniform thickness of the photoresist solids (i.e. the photoactive polymer material minus most of the solvent in the original photoresist composition remains on the surface of the wafer. Then the wafer is removed from the spinning chuck for further processing.

The parameters of conventional spin coating of wafers are discussed in detail by K. Skidmore in "Applying Photoresist for Optimal Coatings" in the Feb. 1988 issue of Semiconductor International at pages 56-62. This article is incorporated herein by reference in its entirety.

One major problem of spin coating photoresist compositions onto substrates is that most of the dispensed photoresist material does not remain on the wafer. This results in either the waste of this excess photoresist material or in requiring reformulation and recycle of that material. Either alternative drastically raises the overall cost of applying the photoresist.

Separately, the technique of applying atomized droplets of material by means of an ultrasonic spray nozzle onto a substrate has been known.

Ultrasonic spray nozzles have been manufactured by Sono-Tek Corporation of Poughkeepsie, New York. Their ultrasonic nozzles have been described in U.S. Pat. Nos. 4,153,201; 4,301,968; 4,337,896; 4,352,459; 4,541,564; 4,642,581; and 4,723,708; all which are assigned to Sono-Tek and are incorporated herein by reference in their entireties.

Such ultrasonic spray nozzles have been used to apply coatings of many materials onto substrates. For example, such nozzles have been employed to apply a gelatine layer over spin-coated photoresist layer to stabilize the photoresist layer against distortion or degradation by heat generated during subsequent etching, ion implantation processes and the like. See U.S. Pat. No. 4,806,455, which issued to Nancy C. Labianca on Feb. 21, 1989 and is assigned to MacDermid Inc.

However, prior attempts to employ ultrasonic spray nozzles alone for applying photoresist coatings have been unsatisfactory due to the inability to produce a film of uniform thickness.

Accordingly, a need exists in the photoresist application art to improve upon current spin-coating appication techniques to reduce the present high photoresist dispensed volume per wafer. It is believed that the present invention which uses a combination of atomized spraying with spin-coating has the potential for reducing the amount of dispensed photoresist volumes by at least five—to ten—fold yet achieving suitable photoresist solid films of uniform thickness without a waste of most of the dispensed photoresist now commonly experienced by spin coating processes.

SUMMARY OF THE INVENTION

Accordingly, the present invention is directed to a process for applying a film of uniform thickness of photoresist solids onto a substrate comprising the steps of (a) forming a liquid photoresist composition comprising photoresist solids in a solvent; the solids content of said photoresist composition being in the range from about 10% by weight to about 22% by weight; (b) forming atomized spray droplets of said liquid photoresist composition; (c) allowing said atomized spray to settle by gravity onto a substrate surface, thereby forming a photoresist coating on that surface; and (d) spinning said coated substrate at a pre-determined spin speed and for a pre-determined time to remove substantially all of the solvent in the photoresist coating and to form a film of uniform thickness of photoresist solids on the substrate.

DETAILED DESCRIPTION

The first step in the process of the present invention is forming a liquid photoresist formulation containing a specific solids content. Generally, the photoresist compositions employed in conventional spin-coating process contain too much solids for use in the present process. Accordingly, they should be diluted with more solvent until the operatable solids content range from about 10% to about 22% by weight, based on the total photoresist composition, are achieved. This dilution may be carried out by adding conventional photoresist thinner products (i.e. an all solvent product) to the conventional photoresist product. Preferably, the solids content is from about 12% to about 20%; most preferably, from about 15% to about 19%, by weight of the total photoresist formulation.

The photoresist formulation having the thus controlled solids content is then formed into atomized spray or fog droplets, preferably having an average diameter of less than 100 microns. This is preferably done by passing the liquid photoresist composition through an ultrasonic nozzle. Any ultrasonic nozzle which can atomize photoresist compositions of these controlled solid contents may be used.

The atomized spray droplets of photoresist are then allowed to fall onto a substrate surface. The substrate may be any conventional substrate to which photoresist coatings are normally applied to. Preferably, the substrate is in wafer form. Most preferably, the substrate is a silicon wafer. The time for applying this photoresist coating to conventional semiconductor substrates such as wafers is from about 2 to 6 seconds.

The substrate may be static (i.e. not-spinning) or spinning during this dispersion or coating step. For coating 4 inch silicon wafers, it is preferred to use a static dispersion step. For larger silicon wafers, dynamic coating (spinning while dispersing) may be preferred to obtain a film or uniform thickness over the whole wafer. In such situations, spinning speeds during dispersion from about 500 to 2,000 r.p.m.s are preferred.

After the substrate is coated with the photoresist atomized spray droplets, the coated substrate is spun on a conventional spin-coating apparatus. The spin speed and spin time may be predetermined to obtain the desired optimum photoresist thickness and uniformity of thickness. Generally, it is preferred to employ spin speeds from about 500 to about 6000 r.p.m.s, most preferably from about 1000 to 5000 r.p.m.s. The prepared spin times for much semiconductor wafers is from about 20 to 60 seconds (e.g. for a 4 inch silicon wafer the spinning time is about 30-40 seconds and for a 6 inch silicon wafer, the spinning time is 50-60 seconds).

Many techniques for spin-coating are well known in the art and any such suitable technique may be used herein.

After the spin-coating is completed, the substrate now having the desired photoresist film of uniform thickness is further processed according to conventional methods in the semiconductor and related arts.

The photoresist coating on the substrate is preferably a film of uniform thickness from about 0.5 to about 1.5 microns. The term "film of uniform thickness" as used in specification and claims herein refers to a coating or film which has standard deviation of thickness of the coating of less than about two hundred angstroms (200A).

The following examples further describe the present invention. All parts and percentages are by weight unless otherwise explicitly stated.

EXAMPLES

Various liquid photoresist compositions as shown in Table 1 were made by mixing HPR-204 positive photoresist with LSI thinner. Both of these products are available from Olin Hunt Specialty Products Inc. of West Paterson, New Jersey. HPR-204 is made up of a mixed meta- and para- cresol novolak binder resin, a naphthoquinone-1,2-diazide-5-sulfonic acid triester of a trihydroxy benzophenone sensitizer and a solvent mixture made of 85% by weight ethyl cellusolve acetate, 8.6% by weight butyl acetate and 5.2% by weight xylene and 1.2% by weight ethyl benzene. The solids content of HPR-204 is about 26%±2% by weight. LSI thinner is a solvent mixture composed of the same solvent mixture employed in HPR-204. A 1:1 by volume mixture of HPR-204 with LSI thinner has about 13%±2% solids content by weight; the 2:1 by volume mixture of HPR-204 with LSI thinner has about 17%±2% solids content by weight; the 3:1 by volume mixture of HPR-204 with LSI thinner is about 20%±2% solids content; and the 4:1 by volume mixture of HPR-204 with LSI thinner has about 22%±2% solids content by weight. For each experiment one of these photoresist compositions was fed by gravity through Sono-Tek 8700 Series Microspray Ultrasonic atomizer nozzle (made by Sono-Tek Corporation of Poughkeepsie New York. The ultrasonic power to the nozzle was started up before the resist feed was initiated into the nozzle.

The flow rate of the resist composition was from about 10 to about 20 milliliters per minute for each experiment. The gravitational force and hydraulic pressure of the resist fluid were the only forces on the flow of the resist through the nozzle. No pump was used to transfer the resist composition to the nozzle. Thus, no external pumping pressure was applied to push the resist composition through the nozzle.

For each experiment, the nozzle was held about 2-3 inches above a static 4 inch silicon wafer mounted on a spinner chuck. For each test, the resist liquid was sprayed through the nozzle for 3 seconds. The resist fed line was then closed and the power to the ultrasonic nozzle was shut off. The power for test was between 2 and 3 watts, depending on the solids contents of the photoresist.

Immediately after the 3 second dispense step, the silicon wafer was spun for 35 seconds at one of the spin speeds indicated in Table I. No exhaust was applied during this spinning step.

For each experiment, only 0.5-0.7 cubic centimeters of the liquid photoresist composition was consumer compared to 1.5 to 4 cubic centimeters of resist normally consumed per 4 inch silicon wafer using conventional spin coating techniques.

Table I indicates the average film thickness (in Angstroms) of photoresist solid measured after the spinning step. Ten Thousand Angstroms equals 1 micron. The value in parenthesis is the standard deviation as measured by using a Spectramap 5M200 film thickness mapping system product of Prometrix Corporation of Santa Clara, California.

TABLE 1

Photoresist Solids Film Thickness and their Standard Deviation

| Spin Speed | Volume Ratio of HPR-204 to LSI Thinner | | | | |
|---|---|---|---|---|---|
| | 1:1 | 2:1 | 3:1 | 4:1 | 1:0 |
| 1000 | 7000 (N.M.) | 9300 (35A) | 9900 (70A) | 10400* | ** |
| 3000 | 3400 (N.M.) | 7500 (17A) | 8000 (41A) | 8900 (N.M.) | ** |
| 4500 | 3000 (19A) | 6200 (18A) | 6500 (31A) | 7600* | ** |
| 6000 | 2900 (N.M.) | 4560 (8A) | 5200 (18A) | 6400* | ** |

* = coatings were made but uniformity was very poor due to difficulties for turning the nozzle powering units.
** = unable to make according to the process of the present invention

What is claimed:

1. A process for applying a film of uniform thickness of photoresist solids onto a substrate comprising the steps of:
   (a) forming a liquid photoresist composition comprising photoresist solids in a solvent; the solids content of said photoresist composition being in the range from about 10% by weight to about 22% by weight;
   (b) forming atomized spray droplets of said liquid photoresist composition;
   (c) allowing said atomized spray droplets to settle by gravity onto a substrate surface, thereby forming a photoresist coating on that surface; and
   (d) spinning said coated substrate at a pre-determined spin speed and for a pre-determined time to remove substantially all of said solvent from said photoresist coating and to form a film of uniform thickness of photoresist solids on the substrate.

2. The process of claim 1 wherein said atomized photoresist spray droplets are formed in step (b) by means of an ultrasonic spray nozzle.

3. The process of claim 2 wherein said liquid photoresist composition is fed by gravity into the ultrasonic spray nozzle.

4. The process of claim 3 wherein the liquid photoresist composition is fed into said ultrasonic spray nozzle by at a rate of about 10 to about 20 milliliters per minute for about 2 to about 6 seconds per substrate being coated.

5. The process of claim 1 wherein the solids content of said photoresist composition is from about 12% to about 20% by weight.

6. The process of claim 1 wherein the solids content of the photoresist is from about 15% to about 19% by weight.

7. The process of claim 1 wherein said substrate is a silicon wafer.

8. The process of claim 1 wherein said coating step (c) is carried out while said substrate is spinning.

9. The process of claim 8 wherein said coating step (c) is carried out at a spin speed from about 500 to about 2000 rpms.

10. The process of claim 1 wherein said spinning step (d) is carried out at a spin speed from about 1000 to about 6000 rpms for about 20-60 seconds.

11. The process of claim 1 wherein said film of uniform thickness of photoresist solids is from about 0.5 to 1.5 microns in thickness.

12. A process for applying an uniform thick film photoresist solids onto a substrate comprising the steps of:
  (a) forming a liquid photoresist composition comprising photoresist solids in a solvent; the solids content of said photoresist composition being in the range from about 12% by weight to about 20% by weight;
  (b) feeding said liquid photoresist composition by gravity to an ultrasonic spray nozzle at a rate of about 10 to 20 millileters per minute;
  (c) passing said liquid photoresist composition through said ultrasonic spray nozzle, thereby forming atomized spray droplets of said liquid photoresist composition;
  (d) allowing said atomized spray droplets to settle on a substrate, said settling time being from about 2 to 6 seconds per substrate thereby forming a photoresist coating on said substrate; and
  (e) spinning said coated substrate at a pre-determined spin speed in the range from about 1000 to about 6000 rpms and for a predetermined spin time for about 20 to 60 seconds, thereby forming a film of uniform thickness of photoresist solids on said substrate.

13. The process of claim 12 wherein said solids content of said photoresist composition is from about 15% to about 19% by weight.

14. The process of claim 13 wherein said substrate is a silicon wafer.

15. The process of claim 14 wherein said coating step (d) is carried out while said substrate is spinning.

16. The process of claim 15 wherein said spinning for coating step (d) is carried out at a spin speed of about 500 to 2000 rpms.

17. The process of claim 16 wherein said spinning step (e) is carried out at a rpm speed of about 1500 to about 5000 rpms.

18. The process of claim 17 wherein said uniform thick film of photoresist solids is from about 0.5 to 1.5 microns in thickness.

* * * * *